United States Patent

[11] 3,597,667

[72] Inventor Fordyce H. Horn
Schenectady, N.Y.

[21] Appl. No. 530,811
[22] Filed Mar. 1, 1966
[45] Patented Aug. 3, 1971
[73] Assignee General Electric Company

[54] SILICON OXIDE-SILICON NITRIDE COATINGS FOR SEMICONDUCTOR DEVICES

11 Claims, 4 Drawing Figs.

[52] U.S. Cl. .......... 317/235, 148/187, 117/215, 117/217
[51] Int. Cl. .......... H01l 11/00
[50] Field of Search .......... 317/234, 235

[56] References Cited

UNITED STATES PATENTS

| | | | |
|---|---|---|---|
| 3,165,430 | 1/1965 | Hugle | 148/187 |
| 3,246,214 | 4/1966 | Hugle | 317/235 |
| 3,287,243 | 11/1966 | Ligenza | 204/192 |
| 3,373,051 | 3/1968 | Chu et al. | 117/106 |
| 3,384,829 | 5/1968 | Sato | 330/7 |
| 3,391,023 | 7/1968 | Frescura | 117/212 |
| 3,250,967 | 5/1966 | Rose | 317/234 |
| 3,312,879 | 4/1967 | Goodejahn | 317/234 |
| 3,391,309 | 7/1968 | Hacskaylo | 317/235 |
| 3,442,701 | 5/1969 | Lepselter | 117/212 |
| 3,385,729 | 5/1968 | Larchian | 317/235 |

OTHER REFERENCES

Wolf, Electronics, Nov. 29, 1963, pages 44— 45.

*Primary Examiner*—Jerry D. Craig
*Attorneys*—Richard R. Brainard, Paul A. Frank, John F. Ahern, Edward D. Murphy, Frank L. Neuhauser, Oscar B. Waddell and Melvin M. Goldenberg

ABSTRACT: Semiconductor devices having improved surface coatings to provide surface passivation and/or electrical insulation include a composite insulating layer. Insulating layer has a first layer of oxide covering and insulating the semiconductor surface. A second layer of silicon nitride is formed over the oxide layer and adds its greater density and lack of permeability characteristics to the insulating characteristics of the oxide.

PATENTED AUG 3 1971 3,597,667

Inventor:
Fordyce H. Horn,
by Edward D. Murphy
His Attorney.

SILICON OXIDE-SILICON NITRIDE COATINGS FOR SEMICONDUCTOR DEVICES

IMPROVED PLANAR SEMICONDUCTIVE DEVICES

This invention relates to planar semiconductive devices which include an insulating oxide layer disposed over the surface of the device.

Planar passivated devices and integrated circuits are of particular importance in the general field of semiconductors, principally because of their extremely small size and substantially lower cost. Simultaneous operations on a single wafer produce 1,000 or more devices, thus distributing the expense of the process and minimizing the cost per device. It is accordingly, of interest to increase the quality of planar devices so that these advantages can be realized in circuits for which the performance requirements are high.

Planar devices generally comprise a body of semiconductive material, such as silicon or germanium, having a substantially planar surface, and an insulating layer comprising a metallic oxide over the planar surface. The devices may include a metal contact over the insulating layer as in the case of varactors or capacitors, or a junction between regions of varying conductivity in the semiconductive material as in the case of diodes or conventional transistors, or various combinations of these, as in field effect transistors. Conventionally, the insulating layer used is an oxide of silicon because, on silicon wafers, it can readily be produced by baking the silicon in oxygen, it is an effective diffusion mask for certain impurities and it serves to provide a degree of electrical and chemical isolation of the surface. Also, because it is produced by driving oxygen into unexposed silicon, the oxide-silicon interface is completely clean, thus avoiding the problems caused by depositing a material on the semiconductor.

However, planar devices including such oxide layers have been subject to several problems which limit the performance characteristics obtainable, necessitate the use of great care in the handling of the devices and contribute substantially to the cost of such devices. A particularly severe example of this is the instability of planar devices under high temperature which arises, despite the supposed insulating effect of the oxide layer, from contamination by various impurities such as aluminum, alkali metals and water vapor. Also, it has been found that application of a positive voltage to an aluminum contact overlying such oxide-semiconductors causes deterioration of the oxide, perhaps due to the reduction of $SiO_2$ to SiO by the aluminum electrodes, and a short circuit occurs. Finally, the relatively low insulating ability of silicon dioxide due to its low dielectric strength reduces the breakdown voltage of the devices.

It is accordingly an object of this invention to provide new and improved planar semiconductive devices.

It is a further object of this invention to provide new and improved planar devices of the oxide semiconductor type.

Another object is the provision of new and improved planar passivated semiconductive junction devices.

A further object is the provision of new and improved planar semiconductive devices of the metal-oxide-semiconductor type.

It is also an object of this invention to provide new and improved planar devices of the oxide-semiconductor type including an improved high stability, impermeable passivation structure.

Another object of this invention is the provision of new and improved planar devices of the oxide-semiconductor type in which the above-mentioned surface effects are eliminated.

Briefly, in accord with one embodiment of this invention, we provide improved planar oxide coated semiconductive devices having increased stability and impermeability which include a body of semiconductive material of predetermined conductivity having a substantially planar surface and an oxide layer contiguous with the surface. The device may include additional regions of different conductivity and junctions between such regions, the regions and junctions emerging in the planar surface. In accord with this invention, a layer of silicon nitride is provided contiguous with at least selected portions of the oxide layer to stabilize and seal the device.

In a specific embodiment, the insulating layers serve to passivate the underlying structure such as the regions of differing conductivity and junctions therebetween. In this case, the oxide thickness may range between 0.1 and 1 micron and the nitride may range from 50 Angstrom units to 500 Angstrom units or more if desired. In another embodiment, a metallic electrode is disposed over the nitride and an electric field is applied between it and the underlying semiconductor. In this case, the oxide thickness may range from 100 to 3,000 Angstrom units and the nitride thickness may range from 50 to 500 Angstrom units.

The novel features believed characteristic of the invention are set forth in the appended claims. The invention itself, together with further objects and advantages thereof may best be understood by reference to the following description taken in connection with the appended drawings in which:

Figure 1:
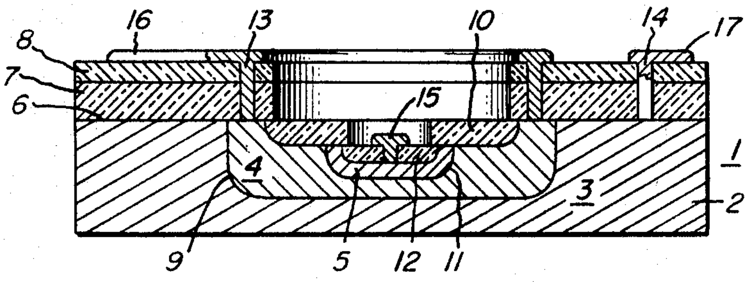
FIG. 1 is a schematic view in vertical cross section of a device constructed in accord with the present invention.

In FIG. 1 a transistor 1 embodying the present invention is illustrated. The device comprises a body 2 of silicon containing three regions of different conductivity. As used throughout the specification and claims, the reference to regions of different conductivity is intended to apply to differences in numerical level and/or type of conductivity. The transistor of FIG. 1 may, for example, comprise a phosphorous-doped *n*-type collector 3, a boron-doped *P*-type base 4 and a phosphorous-doped *n*-type emitter 5.

In the conventional planar process, such a device is produced by providing the phosphorous-doped body 2 with an oxide coating on a planar surface 6, diffusing boron through an opening made in the oxide, reoxiding the opening and diffusing phosphorous through a smaller opening within the area of original opening.

In accord with the present invention, a coating of silicon nitride, $Si_3N_4$, is provided after one or more of the oxide coatings has been produced, the number of nitride coatings depending on the requirements of the particular device. For example, in a transistor, it may be sufficient to provide a nitride coating only after the first oxide coating so as to cover the collector-base junction. Since this junction is between two lightly doped regions, it is subject to breakdown at low voltage. The nitride coating of this invention increases the breakdown voltage by a factor of two or more. The single nitride is sufficient if the oxide produced in later steps is sufficiently stable for the intended use. In other devices, it may be desirable to provide nitride coatings over some or all of the oxide coatings or only over the last oxide coating.

In the transistor of FIG. 1, for convenience of illustration, the silicon nitride has been applied only after the first oxide coating. Thus, the passivation structure comprises an oxide layer 7 covered by a silicon nitride layer 8. In the central region of the device, these layers have been removed by photolithographic techniques for the diffusion of the impurity which produces region 4 and junction 9. Either during or after the introduction of the impurity, another oxide coating 10 is produced in the silicon. An opening is then produced photolithographically in the oxide 10 and region 5 is produced by diffusion of an impurity to junction 11. This may be accompanied or followed by production of another oxide layer 12 over region 5. Finally, holes are produced in the layers and electrodes 13, 14 and 15 are provided by evaporation of a metal, usually aluminum, into the holes and onto surface areas to provide landing pads broad enough for the attachment of wire electrodes.

As previously noted, the breakdown voltage of collector-base junctions formed with the overlying silicon nitride coating has been found to be increased by a factor of two or more over similar junctions covered with an oxide coating but without the silicon nitride. Other advantages obtained from the improved passivation structure include stability and avoidance of the effect of electrodes on the oxide.

More specifically, the silicon nitride apparently prevents the introduction of impurities such as alkali metal ions and water vapor which are believed to have been responsible for the substantial instabilities found in devices coated only with an oxide. For example, the alkali ions may be introduced into the oxide during the evaporation of electrodes; these ions are then believed to drift through the oxide causing shifting fields which in turn shift the operating characteristics of the device. Water vapor may enter into the oxide from the atmosphere and also has a deteriorating effect thereon. In accord with this invention, the instabilities which arise in the operation of conventional oxide coated devices are substantially reduced in devices which have been covered with a coat of silicon nitride.

It has also been found that the oxide underlying the aluminum electrodes, for example the landing pads 16 and 17 shown as part of electrodes 13 and 14 in FIG. 1, tend to produce a conductive path through the oxide if left under a positive bias for a sufficient length of time. In devices coated with silicon nitride, this effect has been found to be eliminated. Also, as previously noted, the breakdown voltage of nitride-coated devices is increased substantially, apparently due to the higher dielectric strength of silicon nitride as compared to the conventional oxide. An additional advantage of this invention is that, due to the impermeability of the nitride coating, the expense of encapsulating the device, which constitutes a substantial portion of the total cost, may be avoided in some situations. In conventional devices, encapsulation is required since otherwise the oxide may be destroyed by ambient impurities such as water vapor. The nitride coatings of the present invention had been found to be impervious to such impurities and therefore, the devices need not be encapsulated. In addition to the large cost advantage, this also reduces size and weight of the device.

In general, it is noted that the device shown in FIG. 1 is only exemplary of the application of the present invention. For example, it is noted that the terms "planar" and "substantially planar" as used in the description and claims are applied, in accord with the terminology used in the art, to devices and circuits prepared by diffusion of impurities into or epitaxial deposit of thin layers on to a semiconductive wafer having a substantially planar surface. The minor variations introduced by epitaxy or by conversion to an oxide and removal of same in selected regions actually produce a variation of only a few microns in a device having a width of 1 or 2 millimeters and a depth in the order of ½ millimeter and are thus not significant. Furthermore, it is intended that this invention include those devices or circuits which include diffusion into two substantially parallel surfaces of a single wafer.

Furthermore, it is noted that although this description is given in terms of silicon for convenience and because of the unique advantages of this advantage as applied to silicon, it is fully intended that planar devices produced in other semiconductive materials being included. In general, therefore, this invention is directed to the provision of a silicon nitride coating over at least selected regions of an oxide insulating layer which covers a planar semiconductive circuit or device, whether the material be germanium, silicon or, for example, gallium arsenide. In the case of silicon, the oxide is generally produced by direct growth into the wafer; in other materials, an oxide such as silicon dioxide may be deposited by sputtering or other oxides may be used.

It is noted that the present invention is particularly applicable to silicon since only in silicon is the oxide produced by direct growth into a virgin crystal lattice, thus enabling one to continue the advantages of a clean oxide-silicon interface and, at the same time, to achieve those described herein for the nitride-oxide combination.

In the particular case of junction devices, in which the junctions and the regions of varying conductivity emerge at the planar surface of the semiconductor, the oxide layer used is relatively thick and serves as a "passivating" layer. This effect includes electrical insulation from overlying electrodes, chemical isolation of the semiconductor from atmospheric impurities and avoidance of breakdown due to the formation of channels around the junction in the covering material. In the case of such devices, it is generally preferred that the oxide layer be in the range of from 0.1 to 1 micron although it may lie beyond micron although it may lie beyond this range in some cases. It has been found that the silicon nitride coating of the present invention need only be on the order of a few hundred Angstrom units thick to accomplish the above-described advantages. In general, the nitride coating should range in thickness from 50 to 500 Angstrom units although thicker coatings may be applied.

Figure 2:
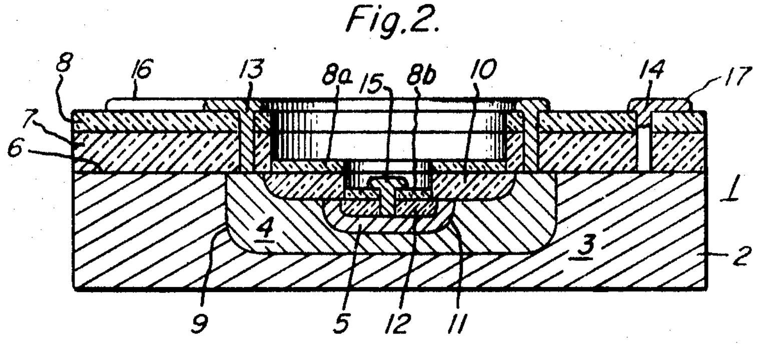
FIG. 2 is a schematic view in vertical cross section of another device according to the present invention.

In FIG. 2, a transistor is illustrated in which the improvements and advantages gained by the use of the present invention are provided over the entire surface of the device by producing a nitride on each of the respective oxide coatings during preparation of the device. The device is similar to that of FIG. 1 and corresponding elements are designated by corresponding numbers. The additional nitride coatings, identified as elements 8*a* and 8*b*, are respectively deposited on the oxide layers 10 and 12. This is accomplished by depositing silicon nitride on the surface of the wafer after each oxide is produced and prior to etching the opening in the respective oxides for the next process.

The devices prepared in accord with the present invention include the many advantages of previously known oxide-coated planar devices while avoiding the disadvantages thereof. For example, oxide-coated devices are preferred because the oxide-semiconductor interface maintains a given surface potential in the semiconductor while other insulators allow carrier leakage and drift of the surface potential. In some cases, the oxide forms a better mask during introduction of impurities than other coatings do. Also, in the case of silicon, the oxide is usually produced by direct growth into the silicon, thus providing a clean oxide-silicon interface. This fact also permits control to be established over the impurity concentration since, if an incorrect amount of the impurity is predeposited, the growth rate of an oxide during diffusion may be used to compensate. Finally, in present photolithographic processes, an oxide coating is preferred because a thick oxide, required for passivation, etches more readily than the photoresist layer. Other thick coatings are difficult to etch and the photoresist mask may be inadvertently removed.

The method of making devices in accord with this invention corresponds exactly with that of the prior art with the exception of the step of providing a nitride coating. The process generally includes oxiding a semiconductive wafer, masking and etching photolithographically to produce openings and introduction of the desired impurity. This may be done by direct diffusion or by predeposition and diffusion. To accomplish the nitriding step after any oxide coating step, a suitable system for depositing silicon nitride may be used, for example, a furnace containing an atmosphere of $SiH_4$ and ammonia is satisfactory. It has been found that coatings of silicon nitride approximately 300 Angstrom units thick may be produced by maintaining the wafer at a temperature of 1,000° C. for about 1 minute in such an atmosphere.

The photolithographic steps preparatory to etching the required openings for diffusion of impurity are exactly the same as those of the prior art, for example, as described in the publication "Photosensitive Resist for Industry," published by the Eastman Kodak Company, 1962. It has been found that the chemicals used to etch the oxide are also suitable for etching silicon nitride, although the times involved are somewhat longer. For example, an appropriate aperture can be etched in a layer of oxide 10,000 Angstrom units thick by an HF solution in about 1 minute while the etching of 300 Angstrom units of silicon nitride in the same solution requires approximately 2 minutes.

Figure 3:
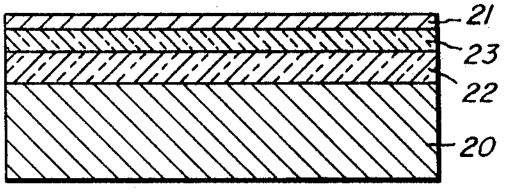
FIG. 3 is a schematic view in vertical cross section of an alternative device according to this invention.

FIG. 3 illustrates, as an alternative embodiment of this invention, a capacitor, which may, for example, be used in many applications as a varactor, comprising a semiconductor body 20 and a metal layer 21 separated by insulating material. In accord with this invention, the conventional oxide layer 22 is covered by a layer 23 of silicon nitride. In the case of capacitors and other devices in which a field is applied across the insulating layer, the thickness of the oxide is substantially less than that used for passification of junction devices, being on the order of a few hundred to 1000 Angstrom units rather than several thousand as in passivation.

In previous devices, the difficulties of contamination of the oxide by ions and the subsequent drift thereof has interfered severely with stable operation of the devices, particularly since the oxides are thin and since the operation of the devices is based on the effect of a field across the oxide. Therefore, these ions cause especially severe difficulties. This is further magnified by the fact that the metallic contact is of relatively broad area and the number of ions which may enter the oxide is increased. Also, the deterioration of silicon dioxide in the presence of metals, for example aluminum, and the resultant short circuit through the oxide is hastened by the broad area contact and by the shallow depth of the oxide.

Provision of the additional coating of silicon nitride in accord with this invention has been found to overcome these difficulties and results in devices which are substantially more stable and less subject to deterioration than previous devices. Alkali ions present during the evaporation of the contact cannot pass through the nitride layer and are thus prevented from changing the operating characteristics of the device. The aluminum of the contact cannot chemically react with the oxide since it is separated therefrom and therefore the short circuit through the oxide does not develop.

A comparison of devices prepared from similar wafers, coated with identical oxides has shown that the drift of the devices coated with silicon nitride is reduced to less than 1 volt when held at temperatures up to 300° C. for 10 hours or more as compared to a drift of 25 volts for the devices without the nitride after 1 hour at 280° C. The number of short circuits through the insulating layer when the metal contact is positively biased has been found to be greatly reduced when coated with silicon nitride. Finally, as previously noted, the provision of the nitride permits the device to be used without the expense, size and weight of encapsulation since ambient impurities such as water vapor which destroy the conventional oxide do not penetrate the nitride. Again, it is noted that the present invention results in an improvement over the presently known oxide devices which permits the advantages previously noted, such as the clean interface, the improved masking of some impurities, and the diffusion control ability to be retained while overcoming the noted disadvantages.

Figure 4:
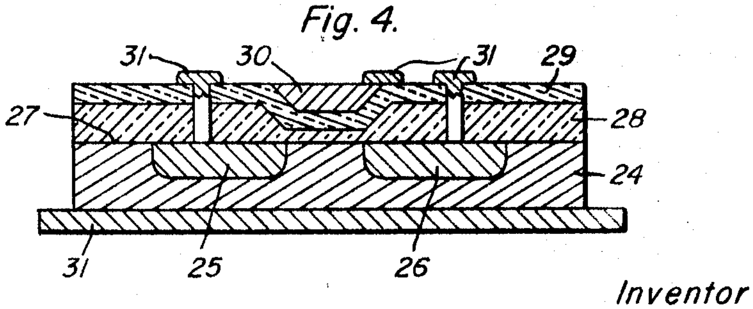
FIG. 4 is a schematic view in vertical cross section of a preferred embodiment of the present invention.

FIG. 4 illustrates a field effect transistor prepared in accordance with the present invention. The device comprises a body of silicon 24 of predetermined conductivity having therein two separate regions 25 and 26 of opposite conductivity type. Overlying the planar surface 27 of body 24, there is provided the conventional oxide layer 28 and, in accord with the present invention, a layer 29 of silicon nitride. An aluminum gate electrode 30 is also provided and contacts 31 are made to the various regions of the device. The oxide layer 28 is relatively thick for passivation except in the central region of the device between the two opposite conductivity regions 25 and 26. In accord with conventional operation of such devices, a field is applied across the oxide in this central region to control the width, and therefore the amount of conduction, through a channel between the two regions. The oxide layer conventionally used in such devices is on the order of several hundred to more than 1000 Angstrom units in thickness.

In accord with this invention, a layer on the order of a few hundred Angstrom units of nitride overlies the oxide which, in the region of thick oxide, functions as previously described in connection with the transistors of FIGS. 1 and 2 to enhance the passivating effect of the oxide. In the central region above conduction channel, the nitride functions similar to that described with relation to the capacitor shown in FIG. 3; that is, it insulates the oxide from the aluminum electrode 30, prevents introduction of ions which might interfere with the applied field and it increases the breakdown voltage of the insulating structure.

In tests conducted on devices constructed in accord with this invention, it has been found that the nitride placed over the oxide in the region above the channel is preferably less than the thickness of the oxide. Again, the present invention results in the provision of a device which embodies the advantages of the conventional oxide while overcoming the previously encountered disadvantages thereof.

It is noted that, in the case of devices such as the field effect transistor which combine the structure of the junction devices with that of the capacitor devices, the present invention is particularly advantageous in that, where the conventional oxide overlying the junction must be relatively thin to allow the field applied to have the desired effect so that it permits the possibility of voltage breakdown, the higher dielectric strength of the nitride layer of the present invention increases the breakdown voltage without substantially increasing the thickness of the layer.

While I have shown and described several embodiments of my invention, it will be apparent to those skilled in the art that many changes and modifications may be made without departing from my invention in its broader aspects; and I therefore intend the appended claims to cover all such changes and modifications as fall within the true spirit and scope of my invention.

I claim:

1. A high-stability planar-type semiconductor device wherein signal translation occurs at an active, substantially planar major semiconductor surface comprising:

a. a monocrystalline wafer of a semiconductor material having an active, substantially planar, major surface and containing at least two regions of differing conductivity type with at least one junction therein which intersects a portion of said active major surface;

b. an insulating dielectric layer covering substantially all of said major surface;

c. at least one conductive potential bearing metal member disposed over a portion of said insulating dielectric layer; and d. means contacting a restricted surface portion of one of said regions of said semiconductor wafer and said conductive metal member for supplying operating potentials thereto;

e. said insulating dielectric layer comprising:

$e_1$. a first insulating passivating layer comprising silicon dioxide formed upon said active major surface of said semiconductor wafer and covering said junction; and $e_2$. a second alkali metal ion impervious stabilizing layer of amorphous silicon nitride overlying substantially all of said silicon dioxide layer and interposed between said silicon dioxide layer and said conductive metal member.

2. The device of claim 1 wherein said silicon dioxide layer is thicker than said silicon nitride layer.

3. The device of claim 1 wherein and said silicon nitride layer is at least approximately 300 A. thick.

4. The device of claim 1 wherein at least one additional conductive metal member is formed upon said insulating layer and said insulating dielectric layer is sufficiently thin that the application of an electric potential to said additional conductive member is effective to produce an electric field within the surface-adjacent region of said semiconductor wafer to cause signal translation.

5. A field effect transistor comprising:

a. a monocrystalline body of semiconductor material having an active substantially planar major surface and having therein different conductivity-type active major surface-adjacent source and drain regions b. said source and drain regions each defining with the main body of said semiconductor an asymmetrically conductive junction which intersects said major substantially planar surface and mutually defining therebetween a surface-adjacent channel region at the active major substantially planar surface of said body;
c. an insulating dielectric layer covering substantially all of said major surface and passivating said junctions;
d. a gate member disposed over said channel and operative when properly biased to control electric current conduction through said surface-adjacent channel region;
e. contact means extending through said insulating dielectric layer and making electrical contact with restricted portions of said source and drain regions respectively;
f. conductive means connected to at least one of said gate member and said source and drain contact means and overlying said insulating dielectric layer;
g. said insulating dielectric layer comprising:
$g_1$. a first insulating passivation layer comprising silicon dioxide formed upon said active major surface of said semiconductor body and covering said junctions and
$g_2$. a second alkali metal ion impervious stabilizing layer of amorphous silicon nitride overlying substantially all of said silicon dioxide layer and interposed between said silicon dioxide layer and said conductive means.

6. The device of claim 5 wherein said silicon dioxide layer is thicker than said silicon nitride layer.

7. The device of claim 6 wherein said silicon nitride layer is at least approximately 300 A. thick.

8. A bipolar junction transistor device comprising:
a. a monocrystalline wafer of semiconductor material having a major substantially planar active surface;
b. emitter collector and base regions respectively located within said wafer and each having a portion thereof adjacent a portion of said active major surface;
c. An emitter junction separating said emitter and said base regions and intersecting said active major substantially planar surface;
d. A collector junction separating said base and said collector regions and intersecting said major active substantially planar surface;
e. An insulating dielectric layer covering substantially all of said active major surface and passivating said junctions;
f. Contact members penetrating said insulating dielectric layer and making electric contact electric contact to restricted portions of the surface of at least each of said emitter and said base regions respectively; and
g. Conductive means connected to at least one of said contact members and overlying at least a portion of said insulating dielectric layer;
h. Said insulating dielectric layer comprising:
$h_1$. a first insulating passivating layer comprising silicon dioxide formed upon said active major surface of said semiconductor body and covering said junction; and
$h_2$. a second alkali metal ion impervious stabilizing layer of amorphous silicon nitride overlying substantially all of said silicon dioxide layer and interposed between said silicon dioxide layer and said conductive means.

9. The device of claim 8 wherein said silicon dioxide layer is thicker than said silicon nitride layer.

10. The device of claim 9 wherein said silicon nitride layer is at least approximately 300 A. thick.

11. A planar transistor device comprising:
a. a body of monocrystalline semiconductor of a one conductivity type having an active substantially planar major surface;
b. a base region of different conductivity type diffused into a portion of said semiconductor body adjacent said active major surface, and defining therewith a collector junction which intersects said active major surface;
c. an emitter region of one conductivity type diffused only partially into said base region and occupying a portion thereof adjacent said major surface and defining therewith an emitter junction which intersects said active major surface;
d. an insulating dielectric layer covering substantially all of said major active surface and passivating said junctions;
e. contact means extending through said insulating dielectric layer, and making electrical contact with restricted portions of at least said emitter and base regions respectively;
f. conductive means connected to at least one of said contact means and overlying said insulating dielectric layer;
g. said insulating dielectric layer comprising:
$g_1$. a first insulating passivating layer comprising silicon dioxide formed upon said active major surface of said semiconductor body and covering said junction, and
$g_2$. a second alkali metal ion impervious stabilizing layer of amorphous silicon nitride overlying substantially all of said silicon dioxide layer and interposed between said silicon dioxide layer and said conductive means.